United States Patent
Cho

(10) Patent No.: US 9,632,643 B2
(45) Date of Patent: Apr. 25, 2017

(54) TOUCH INPUT DEVICE

(71) Applicant: HiDeep Inc., Gyeonggi-do (KR)

(72) Inventor: Youngho Cho, Gyeonggi-do (KR)

(73) Assignee: HiDeep Inc. (KR)

( * ) Notice: Subject to any disclaimer, the term of this patent is extended or adjusted under 35 U.S.C. 154(b) by 0 days.

(21) Appl. No.: 14/817,297

(22) Filed: Aug. 4, 2015

(65) Prior Publication Data

US 2015/0338965 A1    Nov. 26, 2015

Related U.S. Application Data

(63) Continuation of application No. 14/683,274, filed on Apr. 10, 2015.

(30) Foreign Application Priority Data

Apr. 10, 2014 (KR) .................. 10-2014-0042870

(51) Int. Cl.
| | |
|---|---|
| G06F 3/041 | (2006.01) |
| G06F 3/044 | (2006.01) |
| G06F 3/045 | (2006.01) |
| H03F 1/34 | (2006.01) |

(52) U.S. Cl.
CPC .............. *G06F 3/044* (2013.01); *G06F 3/045* (2013.01); *G06F 3/0412* (2013.01); *G06F 3/0416* (2013.01); *H03F 1/34* (2013.01)

(58) Field of Classification Search
None
See application file for complete search history.

(56) References Cited

U.S. PATENT DOCUMENTS

| | | | | |
|---|---|---|---|---|
| 2005/0253651 A1* | 11/2005 | Quek | ........................ | H03F 1/34 330/107 |
| 2008/0309628 A1* | 12/2008 | Krah | ..................... | G06F 3/0412 345/173 |
| 2009/0284315 A1* | 11/2009 | Kobayashi | ................ | H03F 1/08 330/253 |
| 2014/0267129 A1* | 9/2014 | Rebeschi | ........... | H03K 17/9622 345/174 |
| 2015/0180493 A1* | 6/2015 | Liu | ........................ | H02M 3/06 324/686 |

FOREIGN PATENT DOCUMENTS

KR      1020140007542      1/2014

OTHER PUBLICATIONS

Corresponding Office Action issued by the KIPO on Jun. 19, 2015.

* cited by examiner

*Primary Examiner* — Joseph Haley
(74) *Attorney, Agent, or Firm* — The Belles Group, P.C.

(57) ABSTRACT

A touch input device may be provided that includes: a touch sensor panel including a plurality of drive electrodes, a plurality of receiving electrodes and a plurality of node capacitors formed by the drive electrode and the receiving electrode; a driving part applying a driving signal to the drive electrode; a detector including a receiver which receives a signal including information on a capacitance of the node capacitor through the receiving electrode and integrates the signal; and an input capacitor connected between the receiver and the receiving electrode.

7 Claims, 4 Drawing Sheets

TOUCH INPUT DEVICE

CROSS REFERENCE TO RELATED APPLICATIONS

This application is a continuation of U.S. patent application Ser. No. 14/683,274 filed Apr. 10, 2015, which in turn claims priority under 35 U.S.C. §119 to Korean Patent Application No.: 10-2014-0042870, filed Apr. 10, 2014, the disclosures of which are incorporated herein by reference in their entireties.

FIELD OF THE INVENTION

The present invention relates to a touch input device, and more particularly to a touch input device capable of preventing a signal to noise ratio from becoming lower and of increasing the bandwidth of the frequency response so as to avoid a rear touch problem.

BACKGROUND OF THE INVENTION

A variety of input devices are being used to operate a computing system. For example, input devices like a button, a key, a joystick and a touch screen are being used. Since the touch screen is easy and simple to operate, the touch screen is increasingly being used to operate the computing system.

The touch screen may include a touch sensor panel which may be a transparent panel with a touch-sensitive surface. Such a touch sensor panel is attached to the front side of a display screen, and then the touch-sensitive surface may cover the visible side of the display screen. The touch screen allows a user to operate the computing system by simply touching the display screen with a finger, etc. In general, the touch screen recognizes the touch on the display screen and touch position, and then the computing system analyzes the touch and performs operations in accordance with the analysis.

Here, there is a requirement for a touch input device capable of increasing the signal to noise ratio in accordance with the change of the capacitance change generated by the touch on the touch sensor panel and of solving the rear touch problem.

SUMMARY OF THE INVENTION

One embodiment is a touch input device including: a touch sensor panel including a plurality of drive electrodes, a plurality of receiving electrodes and a plurality of node capacitors formed by the drive electrode and the receiving electrode; a driving part applying a driving signal to the drive electrode; a detector including a receiver which receives a signal including information on a capacitance of the node capacitor through the receiving electrode and integrates the signal; and an input capacitor connected between the receiver and the receiving electrode.

Another embodiment is a touch input device including: a touch sensor panel including a plurality of drive electrodes, a plurality of receiving electrodes and a plurality of node capacitors formed by the drive electrode and the receiving electrode; a driving part applying a driving signal to the drive electrode; and a detector including a receiver which receives a signal including information on a capacitance of the node capacitor through the receiving electrode and integrates the signal. The receiver includes: an amplifier; a feedback capacitor coupled between an output terminal and a negative input terminal of the amplifier; and a resistor which is connected in series to the feedback capacitor and is positioned between the negative input terminal and the output terminal.

DETAILED DESCRIPTION OF THE INVENTION

Figure 1:
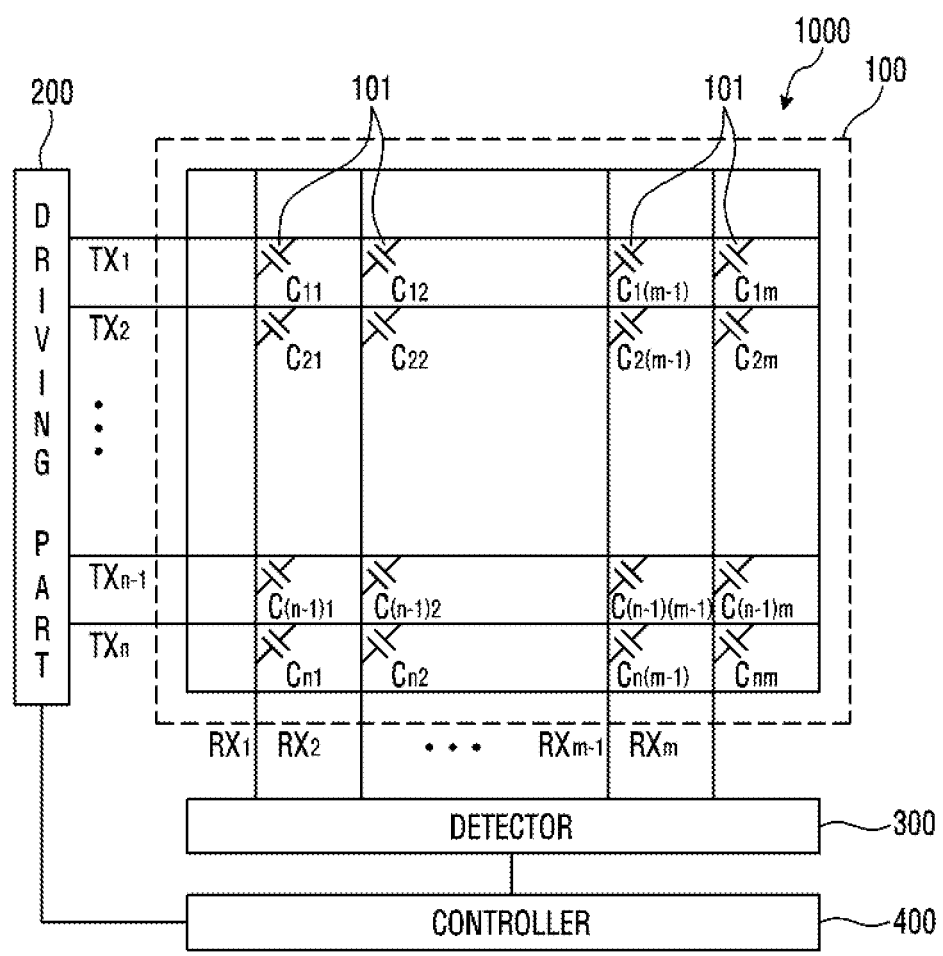
FIG. 1 is a structure view of a touch input device according to an embodiment of the present invention.

The following detailed description of the present invention shows a specified embodiment of the present invention and will be provided with reference to the accompanying drawings. The embodiment will be described in enough detail that those skilled in the art are able to embody the present invention. It should be understood that various embodiments of the present invention are different from each other and need not be mutually exclusive. For example, a specific shape, structure and properties, which are described in this disclosure, may be implemented in other embodiments without departing from the spirit and scope of the present invention with respect to one embodiment. Also, it should be noted that positions or placements of individual components within each disclosed embodiment may be changed without departing from the spirit and scope of the present invention. Therefore, the following detailed description is not intended to be limited. If adequately described, the scope of the present invention is limited only by the appended claims of the present invention as well as all equivalents thereto. Similar reference numerals in the drawings designate the same or similar functions in many aspects.

Hereafter, a touch input device 1000 according to an embodiment of the present invention will be described with reference to the accompanying drawings.

FIG. 1 is a structure view of the touch input device 1000 according to an embodiment of the present invention. Referring to FIG. 1, the touch input device 1000 according to the embodiment of the present invention may include a touch sensor panel 100, a driving part 200, and a detector 300. The touch sensor panel 100 includes a plurality of drive electrodes TX1 to TXn, a plurality of receiving electrodes RX1 to RXm, and a plurality of node capacitors C11 to Cnm formed by the drive electrode TX and the receiving electrode RX. The driving part 200 applies a driving signal to the plurality of drive electrodes TX1 to TXn. The detector 300 receives a signal including information on the capacitance of the node capacitors C11 to Cnm through the receiving electrodes RX1 to RXm and detects touch information on the touch sensor panel 100.

In the embodiment of the present invention, the touch information may include whether a touch object has touched the touch sensor panel 100 or not, a touch position, a touch area, and a touch pressure, etc.

As shown in FIG. 1, the touch sensor panel 100 may include the plurality of drive electrodes TX1 to TXn and the plurality of receiving electrodes RX1 to RXm. The touch sensor panel 100 of the touch input device 1000 according to the embodiment of the present invention may be disposed on or inside a display panel (not shown). The display panel in which the touch sensor panel 100 of the touch input device 1000 according to the embodiment of the present invention may be formed may be included in a liquid crystal display (LCD), an organic light emitting diode (OLED), etc.

While the following description and accompanying drawings show that the plurality of drive electrodes TX1 to TXn and the plurality of receiving electrodes RX1 to RXm of the touch sensor panel 100 form an orthogonal array, the present invention is not limited to this. The plurality of drive electrodes TX1 to TXn and the plurality of receiving electrodes RX1 to RXm has an array of arbitrary dimension, for example, a diagonal array, a concentric array, a 3-dimensional random array, etc., and an array obtained by the application of them. Here, "n" and "m" are positive integers and may be the same as each other or may have different values. The size of the value may be changed depending on the embodiment. As shown in FIG. 1, the plurality of drive electrodes TX1 to TXn and the plurality of receiving electrodes RX1 to RXm may be arranged to cross each other. The drive electrode TX may include the plurality of drive electrodes TX1 to TXn extending in a first axial direction. The receiving electrode RX may include the plurality of receiving electrodes RX1 to RXm extending in a second axial direction crossing the first axial direction.

In the touch sensor panel 100 according to the embodiment of the present invention, the plurality of drive electrodes TX1 to TXn and the plurality of receiving electrodes RX1 to RXm may be formed in the same layer. For example, the plurality of drive electrodes TX1 to TXn and the plurality of receiving electrodes RX1 to RXm may be formed on the same side of an insulation layer (not shown). Also, the plurality of drive electrodes TX1 to TXn and the plurality of receiving electrodes RX1 to RXm may be formed in the different layers. For example, the plurality of drive electrodes TX1 to TXn and the plurality of receiving electrodes RX1 to RXm may be formed on both sides of one insulation layer (not shown) respectively, or the plurality of drive electrodes TX1 to TXn may be formed on a side of a first insulation layer (not shown) and the plurality of receiving electrodes RX1 to RXm may be formed on a side of a second insulation layer (not shown) different from the first insulation layer.

The plurality of drive electrodes TX1 to TXn and the plurality of receiving electrodes RX1 to RXm may be made of a transparent conductive material (for example, indium tin oxide (ITO) or antimony tin oxide (ATO)), or the like. However, this is just an example. The drive electrode TX and the receiving electrode RX may be also made of another transparent conductive material or an opaque conductive material like copper, etc.

Each node capacitor 101 of the touch sensor panel 100 may be formed at a crossing of one drive electrode TX and one receiving electrode RX. While FIG. 1 shows that n number of the drive electrodes TX1 to TXn and m number of receiving electrodes RX1 to RXm are indicated respectively by a line, the drive electrodes and receiving electrodes may be actually implemented by an electrode pattern. Also, the drive electrodes TX1 to TXn and receiving electrodes RX1 to RXm may be implemented to have mutually different widths.

The driving part 200 according to the embodiment of the present invention may apply a driving signal to the drive electrodes TX1 to TXn. In the touch input device 1000 according to the embodiment of the present invention, one driving signal may be sequentially applied at a time from the first drive electrode TX1 to the n-th drive electrode TXn. The driving signal may be applied again repeatedly. Here, through the receiving electrodes RX1 to RXm, the detector 300 receives sequentially from the first receiving electrode RX1 to the m-th receiving electrode RXm a signal including information on a mutual capacitance (Cm) 101 between the receiving electrodes RX1 to RXm and the drive electrodes TX1 to TXn to which the driving signal has been applied, thereby sensing the change amount of the corresponding capacitance. As such, the process of sensing the driving signal applied from the first drive electrode TX1 to the n-th drive electrode TXn through the receiving electrodes RX1 to RXm can be referred to as a process of scanning the touch sensor panel 100. When each scan is performed, a procedure of sequentially applying the driving signal to the first drive electrode TX1 to the n-th drive electrode TXn and a procedure of sequentially receiving the signal from the first receiving electrode RX1 to the m-th receiving electrode RXm may be repeated.

As described above, the capacitance (Cm) 101 with a predetermined value is generated at each crossing of the drive electrode TX and the receiving electrode RX. When an object like a finger approaches close to the touch sensor panel 100, the value of the capacitance may be changed. In FIG. 1, the capacitance may represent the mutual capacitance (Cm). The detector 300 senses such electrical characteristics, thereby being able to sense whether the touch has occurred on the touch sensor panel 100 or not and where the touch has occurred. For example, the detector 300 is able to sense whether or not the touch has occurred and/or where the touch has occurred on the touch sensor panel 100 in a two-dimensional plane consisting of a first axis and a second axis. According to the embodiment, the touch pressure can be detected by detecting the value of the capacitance of the node capacitor 101.

More specifically, when the touch occurs on the touch sensor panel 100, the drive electrode TX to which the driving signal has been applied is detected, so that the position of the second axial direction of the touch can be detected. Likewise, when the touch occurs on the touch sensor panel 100, the capacitance change is detected from the reception signal received through the receiving electrode RX, so that the position of the first axial direction of the touch can be detected.

In the touch input device 1000 according to the embodiment of the present invention, the driving signal applied to the drive electrodes TX1 to TXn by the driving part 200 is coupled by the mutual capacitance of the corresponding node capacitor 101 and is detected through the receiving electrodes RX1 to RXm. As shown in FIG. 1, the touch input device 1000 according to the embodiment of the present invention may include the detector 300 which receives the signal including the information on the capacitance of the node capacitors C11 to Cnm through the receiving electrodes RX1 to RXm and detects the touch information. The detector 300 will be described in more detail with reference to FIGS. 2 and 6.

Figure 2:
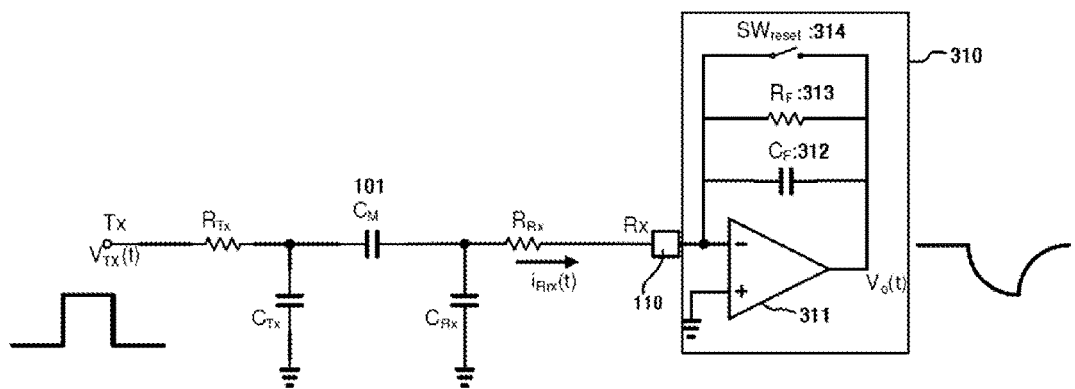
FIG. 2 shows an equivalent circuit of a typical touch sensor panel and a detector.

FIG. 2 shows an equivalent circuit of a typical touch sensor panel and a detector. FIG. 2 shows an equivalent circuit of any one drive electrode TX of the plurality of drive electrodes TX1 to TXn, any one receiving electrode RX of the plurality of receiving electrodes RX1 to RXm, which crosses the one drive electrode TX, and a receiver 310 which receives a signal including information on the capacitance of the node capacitor 101 through the corresponding receiving electrode RX and integrates the signal. The detector 300 according to the embodiment of the present invention may include a plurality of the receivers 310 shown in FIG. 2. For example, the detector 300 may include m number of the receivers 310 which receive respectively the signal including the information on the capacitance from the plurality of receiving electrodes RX1 to RXm. FIG. 2 shows one receiver 310 receiving the corresponding signal from one receiving electrode RX.

In FIG. 2, the node capacitor ($C_M$) 101 is formed between the drive electrode TX and the receiving electrode RX crossing the drive electrode TX. $R_{TX}$ represents the resistance of the drive electrode TX. $R_{RX}$ represents the resistance of the receiving electrode RX. $C_{TX}$ represents a self capacitance formed between the drive electrode TX and a reference potential layer (ground). $C_{RX}$ represents the self capacitance formed between the receiving electrode RX and the reference potential layer (ground). The reference potential layer may be generally any ground layer which is spaced apart from the lower portion of the touch sensor panel 100. The lower portion of the touch sensor panel 100 may be referred to as an opposite side of the touch surface of the touch sensor panel 100. In general, when the touch sensor panel 100 is coupled to the display panel, the reference potential layer may be a ground layer included in the display panel.

$V_{TX}(t)$ is a driving signal which is applied to the drive electrode TX and is a time-dependent voltage signal. The waveform of the $V_{TX}(t)$ is shown just therebelow. $I_{RX}(t)$ is a signal including information on the capacitance of the node capacitor 101, which is transferred to a charge amplifier 311 through the receiving electrode RX. The $I_{RX}(t)$ may be a time-dependent current signal.

The charge amplifier may be shown as the receiver 310 in FIG. 2. The charge amplifier 311 may convert the input current signal $I_{RX}(t)$ into a voltage signal $V_0(t)$. In FIG. 2, the current signal from the receiving electrode RX may be input to a negative input terminal of an amplifier 311 included in the receiver 310 through an RX pin 110. In FIG. 2, since the current signal from the receiving electrode RX corresponds to a virtual ground node of the amplifier 311, the frequency response of the receiver 310 can be obtained from the frequency response between the $V_{TX}(t)$ and $I_{RX}(t)$. That is, the frequency response of the receiver 310 can be obtained from the frequency response between the driving signal $V_{TX}(t)$ at the point where the driving signal is applied to the drive electrode TX and the current signal $I_{RX}(t)$ at the RX pin 110, i.e., the input terminal of the receiver 310.

In the equivalent circuit shown in FIG. 2, a transfer function between the driving signal $V_{TX}(t)$ which is applied to the drive electrode TX and the current signal $I_{RX}(t)$ at the RX pin 110, i.e., the input terminal of the receiver 310 can be represented by the following equation (1).

$$i_{Rx} = \frac{sC_M}{(1+sC_{Tx}R_{Tx})(1+sR_{Rx}C_{Rx})} V_{Tx} \qquad \text{equation (1)}$$

In the transfer function of equation (1), pole and zero are obtained such that z1=0, p1=1/$C_{TX}R_{TX}$ and p2=1/$R_{RX}C_{RX}$. That is, the transfer function of the touch sensor panel 100, which corresponds to equation (1), is shown in the frequency domain shown in FIG. 3.

Figure 3:
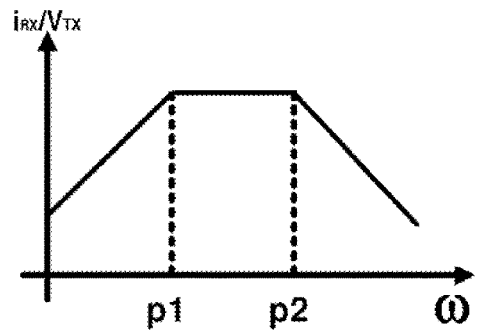
FIG. 3 shows a board plot in which a transfer function of a touch sensor panel according to the embodiment of the present invention is shown in a frequency domain.

FIG. 3 shows a board plot in which the transfer function of the touch sensor panel 100 according to the embodiment of the present invention is shown in the frequency domain. A case where p2>p1 is taken as an example in FIG. 3.

In a system including a typical touch input device 1000, a fundamental frequency of display noise present in the system, noise of the ballast of a lighting device, and noise generated from a charger, etc., may be less than 100 kHz. Therefore, the frequency of the driving signal for driving the drive electrode TX may be set to be relatively high so as to avoid such a noise in the system. Generally, the frequency of the driving signal may have a range between 100 kHz and 1 MHz.

Here, when the resistance value and/or capacitance value (RC value) of the touch sensor panel 100 are large, and thus, p2 is less than the frequency value of the driving signal which is applied to the drive electrode TX, the following problems may occur.

1. A time period enough to charge/discharge the $C_{TX}$ and $C_{RX}$, i.e., the self capacitance in the touch sensor panel 100 may not be obtained. As a result, when the touch occurs on the touch sensor panel 100, the signal change according to the capacitance change of the node capacitor 101 is not large, so that a signal to noise ratio (SNR) may be reduced.
2. When the touch sensor panel 100 is touched by a physical pressure, the distance between the ground layer and the lower portion of the touch sensor panel 100 changes, and thus, the size of the self capacitance ($C_{TX}$ and/or $C_{RX}$) may change. As a result, the positions of p1 and p2 may be changed in the frequency domain shown in FIG. 3. Consequently, the transfer function and frequency response of the touch sensor panel 100 are changed, so that the size of the current signal which is input to the receiver 310 may be changed. A panel bending problem or a rear touch problem that such a change of the current signal is incorrectly recognized as the capacitance change of the node capacitor 101 may occur.

The two foregoing problems are because the frequency of the driving signal which is applied to the drive electrode TX is present in a range where the frequency response is not flat as shown in FIG. 3. In other words, the two foregoing problems may be caused by applying the driving signal at a frequency out of p1 to p2. The solution of these problems will be described below.

More specifically, the foregoing problems can be solved by increasing a range where the frequency response is flat. That is, the foregoing problems can be solved by increasing the bandwidth of the frequency response shown in FIG. 3.

Figure 4:
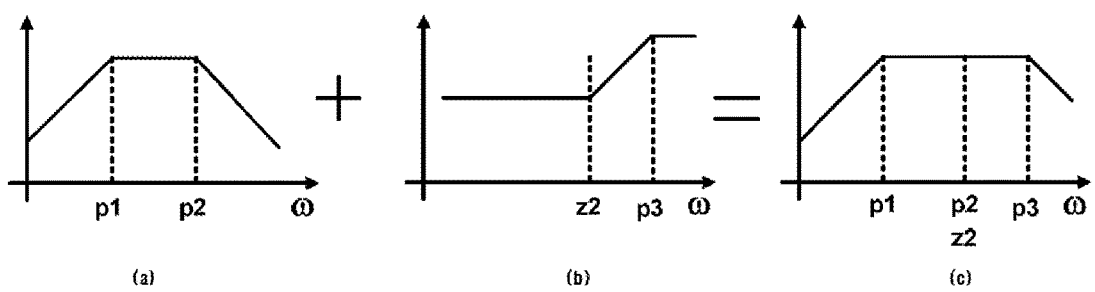
FIG. 4 is a conceptual view for increasing the bandwidth of a frequency response of the touch sensor panel according to the embodiment of the present invention.

FIG. 4 is a conceptual view for increasing the bandwidth of the frequency response of the touch input device according to the embodiment of the present invention. The frequency response shown in FIG. 3 is shown in (a) of FIG. 4. In the frequency response, the range where the frequency response is flat can be increased by inserting another zero into the vicinity of the second pole p2. That is, the touch sensor panel 100 and/or the detector 300 which are included in the touch input device 1000 may be configured such that a new zero is added to the position of a larger one of the poles generated from the frequency response of the touch sensor panel 100. Another pole p3 and z2 located in the vicinity of the p2 are shown in (b) of FIG. 4. A final frequency response obtained by adding (b) to (a) of FIG. 4 is shown in (c) of FIG. 4. As seen in (c) of FIG. 4, it can be understood that the bandwidth of the flat frequency response is increased to a range from p1 to p3 by adding the zero z2 to the position of the p2.

As shown in (c) of FIG. 4, with the increase of the bandwidth of the frequency response of the touch sensor panel 100, the frequency response of the touch input device 1000 can have a wider bandwidth. Moreover, when the frequency of the driving signal which is applied to the drive electrode TX is present in the range where the frequency response is flat, all the two above-described problems can be avoided.

Figure 5:
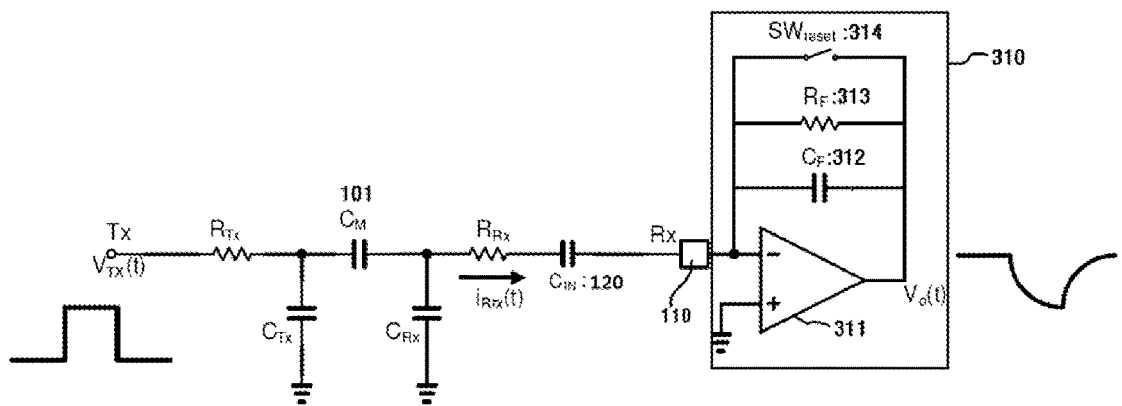
FIG. 5 shows an equivalent circuit of the touch sensor panel and a detector according to the embodiment of the present invention.

FIG. 5 shows an equivalent circuit of the touch sensor panel and the detector according to the embodiment of the present invention. FIG. 5 shows the equivalent circuit capable of increasing the bandwidth of the frequency response of the touch input device 1000 by adding zero to the transfer function between the drive electrode TX and the negative input terminal of the amplifier 311 included in the receiver 310.

Each of a plurality of the receivers 310 included in the detector 300 according to the embodiment of the present invention may include the amplifier 311 and a feedback capacitor 312 which is coupled between the output terminal and the negative input terminal of the amplifier 311, that is to say, which is coupled to a feedback path. In the embodiment of the present invention, the amplifier 311 may be an operational amplifier. In the embodiment of the present invention, the positive input terminal of the amplifier 311 may be connected to the ground. Also, the receiver 310 may further include a reset switch ($SW_{reset}$) 314 which is connected in parallel to the feedback capacitor ($C_F$) 312. The reset switch 314 may reset the conversion from current to voltage that is performed by the receiver 310. The negative input terminal of the amplifier 311 may be connected to the receiving electrode RX and may receive and integrate a current signal including information on the capacitance of the node capacitor 101. The waveform of the output signal of the receiver 310 is shown on the right side of the FIG. 5.

The receiver 310 according to the embodiment of the present invention may further include a resistor ($R_F$) 313 which is connected in parallel to the feedback capacitor 312. The resistor 313 functions as a feedback resistor of the charge amplifier 311 and intends to fix the DC operating point of the amplifier 311. When the feedback of the receiver 310 is implemented to include only the feedback capacitor 312 without the resistor 313, the DC component is not feedbacked, so that the input operating point of the amplifier 311 is not fixed. In this case, it is required to operate the receiver 310 while closing the reset switch 314 for each pulse of the input signal of the amplifier 311.

The data integrated by the receiver 310 may be converted into digital data by an analog to digital converter (ADC). Hereafter, the digital data may be input to a process (not shown) and may be processed to obtain the touch information on the touch sensor panel 100. The detector 300, together with the receiver 310, may include the ADC and processor.

The receiver 310 according to the embodiment of the present invention may further include an input capacitor $C_{IN}$ which is positioned between the receiving electrode RX and the negative input terminal of the amplifier 311. Here, the transfer function between the driving signal $V_{TX}(t)$ which is applied to the drive electrode TX and the current signal $I_{RX}(t)$ at the negative input terminal of the amplifier 311 can be represented by the following equation (2).

$$i_{Rx} = \frac{sC_{IN}}{1+sR_{Rx}C_{IN}} \frac{C_M + sR_{Rx}C_{IN}C_M}{C_M + C_{Rx} + C_{IN} + sR_{Rx}C_{IN}C_{Rx}} \frac{1}{1+sC_{Tx}R_{Tx}} V_{Tx} \quad \text{equation (2)}$$

As seen in equation (2), the transfer function of the equivalent circuit shown in FIG. 5 may have two zeros and three poles. The first zero, i.e., z1 is 0 and the second zero, i.e., z2 is $1/R_{RX}C_{IN}$. Here, $R_{RX}$ may have a fixed value which is not changed after once designed. According to a system including the touch input device 1000 based on the embodiment of the present invention and environment thereof, the bandwidth of the frequency response can be increased by controlling a parameter of the configuration including the input capacitor $C_{IN}$. That is, in the embodiment of the present invention, the input capacitor $C_{IN}$ is added between the receiving electrode RX and the negative input terminal of the amplifier 311, so that a new pole-zero pair may be generated in the frequency response of the touch sensor panel 100. Here, the value of the input capacitor $C_{IN}$ may be set such that the bandwidth of the frequency response of the touch sensor panel 100 is greater than an existing bandwidth of the frequency response by adding the new pole-zero pair. The size of the input capacitor $C_{IN}$ may be predetermined during the manufacture thereof and installed. However, the size of the input capacitor $C_{IN}$ may be implemented by a variable capacitor in such a manner as to change according to the use environment and system.

In this case, the touch input device 1000 according to the embodiment of the present invention may further include a controller 400. Here, a user can automatically and/or manually control the size of the input capacitor $C_{IN}$ through the controller 400 in accordance with a required bandwidth.

Figure 6:
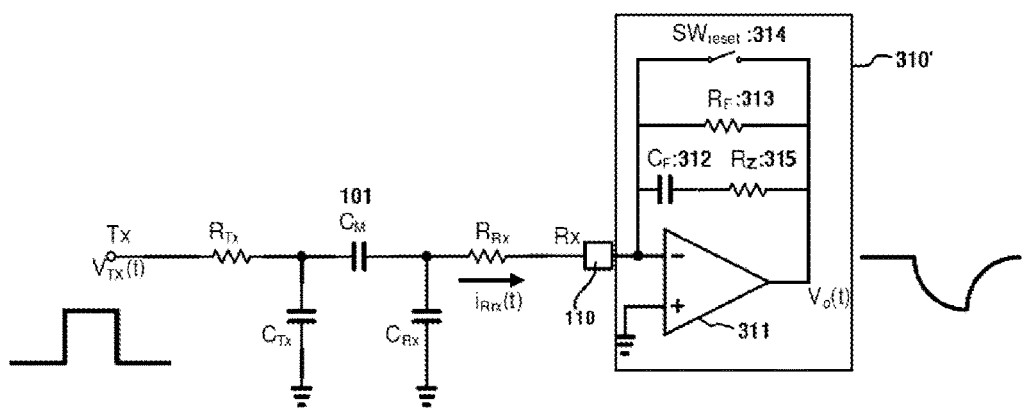
FIG. 6 shows an equivalent circuit of the touch sensor panel and a detector according to another embodiment of the present invention.

FIG. 6 shows an equivalent circuit of a touch sensor panel and a detector according to another embodiment of the present invention. In FIG. 6, a resistor (Rz) 315 which is connected in series to the feedback capacitor 312 without adding the input capacitor $C_{IN}$ and is connected between the negative input terminal and the output terminal is further included, so that it is possible to obtain the same effect as that of the equivalent circuit shown in FIG. 5.

Before the resistor 315 is added, the transfer function between the $I_{RX}(t)$ and $V_0(t)$ in the receiver 310 shown in FIG. 5 can be represented by the following equation (3).

$$V_o(t) = -i_{RX}(t)\frac{1}{sC_F} \quad \text{equation (3)}$$

As shown in FIG. 6, when the resistor 315 is added to the receiver, the transfer function between the $I_{RX}(t)$ and $V_0(t)$ in the receiver 310' can be represented by the following equation (4). Here, since the size of the feedback resistor 313 is relatively very large, the feedback resistor 313 is assumed not to affect the transfer function.

$$V_o(t) = -i_{RX}(t)\frac{1 + sC_F R_Z}{sC_F} \quad \text{equation (4)}$$

Comparing equation (4) with equation (3), it can be found that equation (3) does not include zero and equation (4) includes one zero having a value of $1/C_F R_Z$. That is, in FIG. 6, although the frequency response between the $V_{TX}(t)$ and $I_{RX}(t)$ is not changed from the drive electrode TX to which the driving signal is applied to the RX pin 110, it is possible to obtain the same effect as that of the equivalent circuit shown in FIG. 5 by changing the frequency response of the receiver 310'. Here, in the embodiment of the present invention, the values of the feedback capacitor 312 and/or resistor 315 can be controlled respectively according to a required frequency bandwidth of the touch input device.

Figure 7:
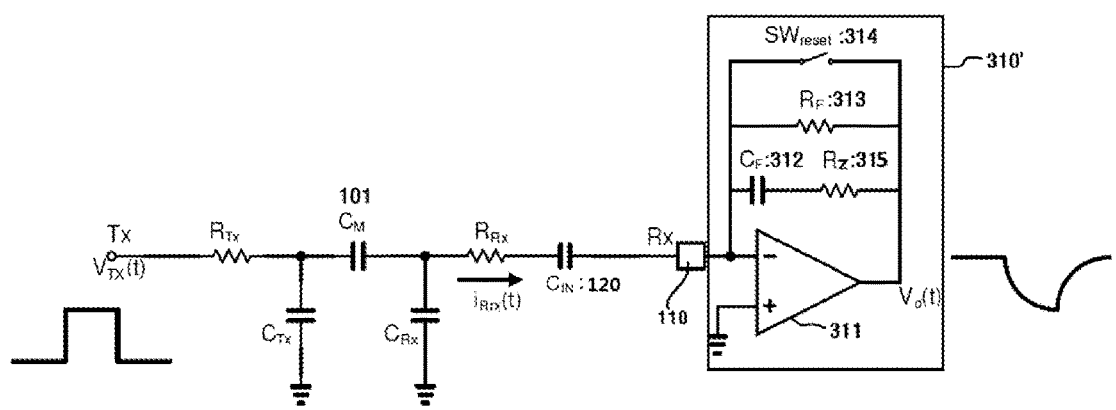
FIG. 7 shows an equivalent circuit of the touch sensor panel and a detector according to further another embodiment of the present invention.

FIG. 7 shows an equivalent circuit of the touch sensor panel and a detector according to further another embodiment of the present invention. FIG. 7 shows an equivalent circuit resulted from the combination of the equivalent circuit of FIG. 5 and the equivalent circuit of FIG. 6. FIG. 7 shows not only that the input capacitor $C_{IN}$ is added between the receiving electrode RX and the negative input terminal of the amplifier 311, but also that the resistor (Rz) 315 which is connected in series to the feedback capacitor 312 and is connected between the negative input terminal and the output terminal is further included. In this case, the addition of the input capacitor $C_{IN}$ 120 causes one zero to be added, and the addition of the resistor (Rz) 315 causes another zero to be added. Therefore, the bandwidth of the frequency response of the touch input device can be more increased. Here, in the embodiment of the present invention, the values of the input capacitor 120, feedback capacitor 312 and/or resistor 315 can be controlled respectively according to a required bandwidth.

Although embodiments of the present invention were described above, these are just examples and do not limit the present invention. Further, the present invention may be changed and modified in various ways, without departing from the essential features of the present invention, by those skilled in the art. For example, the components described in detail in the embodiments of the present invention may be modified. Further, differences due to the modification and application should be construed as being included in the scope and spirit of the present invention, which is described in the accompanying claims.

What is claimed is:

1. A touch detection circuit for a capacitive touch sensor panel comprising a plurality of drive electrodes and a plurality of receiving electrodes, the touch detection circuit comprising:
    a driving part which applies a driving signal of an alternating current (AC) waveform to the drive electrode;
    a charge amplifier including:
        an amplifier to which a signal received from one of the receiving electrodes is inputted;
        a feedback capacitor coupled between an output terminal of the amplifier and a negative input terminal of the amplifier to which the received signal is inputted;
        a resistor connected in series to the feedback capacitor between the negative input terminal and the output terminal; and
        a switch connected in parallel to both the feedback capacitor and the resistor between the negative input terminal and the output terminal; and
    a configuration converting an output signal of the amplifier into a digital signal,
    wherein the feedback capacitor is configured such that a value of the feedback capacitor is controllable; and
    wherein the resistor is configured such that a value of the resistor is controllable.

2. The touch detection circuit of claim 1, further comprising a capacitor between the one of the receiving electrodes and the negative input terminal, wherein one terminal of the capacitor is connected to the one of the receiving electrodes and an other terminal of the capacitor is connected to the negative input terminal.

3. The touch detection circuit of claim 2, wherein the capacitor is configured such that a value of the capacitor is controllable.

4. A touch detection circuit for a capacitive touch sensor panel comprising a plurality of drive electrodes and a plurality of receiving electrodes, the touch detection circuit comprising:
    a driving part which applies a driving signal of an alternating current (AC) waveform to the drive electrodes;
    a charge amplifier comprising:
        an amplifier having at a negative input terminal and receiving, at the negative input terminal, a signal from one of the receiving electrodes;
        a feedback capacitor coupled between an output terminal of the amplifier and the negative input terminal of the amplifier;
        a resistor connected in series to the feedback capacitor between the negative input terminal and the output terminal; and
        a switch connected in parallel to both the feedback capacitor and the resistor between the negative input terminal and the output terminal;
    a configuration converting an output signal of the amplifier into a digital signal; and
    a capacitor connected between the one of the receiving electrodes and the negative input terminal,
    wherein one terminal of the capacitor is connected to the one of the receiving electrodes and the other terminal of the capacitor is connected to the negative input terminal, and
    wherein the feedback capacitor is configured such that a value of the feedback capacitor is controllable.

5. The touch detection circuit of claim 4, wherein the resistor is configured such that a value of the resistor is controllable.

6. The touch detection circuit of claim 4, wherein the capacitor is configured such that a value of the capacitor is controllable.

7. The touch detection circuit of claim 5, wherein the capacitor is configured such that a value of the capacitor is controllable.

* * * * *